US012605784B2

(12) United States Patent
Kwon et al.

(10) Patent No.: US 12,605,784 B2
(45) Date of Patent: Apr. 21, 2026

(54) SEMICONDUCTOR MANUFACTURING EQUIPMENT

(71) Applicant: Samsung Electronics Co., Ltd., Suwon-si (KR)

(72) Inventors: Cheolan Kwon, Suwon-si (KR); Jingyu Moon, Suwon-si (KR)

( * ) Notice: Subject to any disclaimer, the term of this patent is extended or adjusted under 35 U.S.C. 154(b) by 52 days.

(21) Appl. No.: 18/477,910

(22) Filed: Sep. 29, 2023

(65) Prior Publication Data

US 2024/0136321 A1 Apr. 25, 2024
US 2024/0234362 A9 Jul. 11, 2024

(30) Foreign Application Priority Data

Oct. 19, 2022 (KR) ........................ 10-2022-0135229

(51) Int. Cl.
*H01L 23/00* (2006.01)
*B23K 3/02* (2006.01)
*B23K 101/40* (2006.01)

(52) U.S. Cl.
CPC .............. *H01L 24/75* (2013.01); *B23K 3/025* (2013.01); *B23K 2101/40* (2018.08); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2224/75252* (2013.01); *H01L 2224/75621* (2013.01)

(58) Field of Classification Search
None
See application file for complete search history.

(56) References Cited

U.S. PATENT DOCUMENTS

| | | | |
|---|---|---|---|
| 9,576,928 B2 | 2/2017 | Wasserman | |
| 9,997,383 B2 | 6/2018 | Wasserman | |
| 10,199,349 B2 | 2/2019 | Terada | |
| 11,373,975 B2 | 6/2022 | Seyama | |
| 11,482,505 B2 | 10/2022 | Kim et al. | |
| 11,508,688 B2 | 11/2022 | Seyama et al. | |
| 2013/0175324 A1 | 7/2013 | Chang et al. | |
| 2014/0202636 A1* | 7/2014 | Mayr ...................... B30B 15/34 |
| | | | 156/378 |
| 2018/0366434 A1* | 12/2018 | McClain ............. H01L 21/4853 |
| 2020/0312811 A1* | 10/2020 | Kim ........................ H01L 24/75 |
| 2021/0098415 A1* | 4/2021 | Lee ..................... H01L 25/0652 |
| 2021/0398935 A1 | 12/2021 | Kim et al. | |

FOREIGN PATENT DOCUMENTS

| | | | | |
|---|---|---|---|---|
| JP | 2004158547 A | * | 6/2004 | ........ H01L 2924/00 |
| JP | 2007311679 A | * | 11/2007 | |
| JP | 2013-098264 A | | 5/2013 | |

(Continued)

*Primary Examiner* — Devang R Patel

(57) ABSTRACT

Semiconductor manufacturing equipment including a main body having a bonding head, a head heater at a bottom of the bonding head, the head heater including a thermal compression surface, negative pressure channels recessed from the thermal compression surface and the negative pressure channels including holes therein, and a bonding tool having a first surface, a second surface, grooves at the first surface, the first surface configured to contact the thermal compression surface, and the second surface opposite to the first surface contacting a semiconductor chip for thermal compression may be provided.

19 Claims, 16 Drawing Sheets

(56)     References Cited

FOREIGN PATENT DOCUMENTS

| JP | 6405999 | B2 | 10/2018 |
| JP | 6603401 | B2 | 11/2019 |
| KR | 10-1151256 | B1 | 6/2012 |
| KR | 10-1163566 | B1 | 7/2012 |
| KR | 10-1382267 | B1 | 4/2014 |
| KR | 10-2016-0105332 | A | 9/2016 |
| KR | 10-2020-0114573 | A | 10/2020 |

* cited by examiner

SEMICONDUCTOR MANUFACTURING EQUIPMENT

CROSS-REFERENCE TO RELATED APPLICATION

This application is based on and claims priority under 35 U.S.C. § 119 to Korean Patent Application No. 10-2022-0135229, filed on Oct. 19, 2022, in the Korean Intellectual Property Office, the disclosure of which is incorporated by reference herein in its entirety.

BACKGROUND

The technical concepts of the present disclosure relate to semiconductor manufacturing equipment, and more particularly, to semiconductor manufacturing equipment including a bonding tool for a chip bonding process.

As electronic products are miniaturized, flip-chip type semiconductor chips that do not use wire bonding are widely used. Such flip-chip type semiconductor chips have a plurality of electrodes formed on a lower surface thereof and are connected to connection ports formed on a substrate, on which the flip-chip type semiconductor chips are to be mounted via solder bumps. As the chip bonding process, thermal compression bonding is used. Such thermal compression bonding is performed through a bonding head with a head heater and a bonding tool.

SUMMARY

Some example embodiments of the present inventive concepts provide semiconductor manufacturing equipment for improving adhesion between a head heater and a bonding tool used in a chip bonding process.

Example embodiments of the present inventive concepts are not limited to the above-mentioned example embodiments, and other example embodiments will be apparent to those skilled in the art from the following description.

According to an example embodiment of the present inventive concepts, semiconductor manufacturing equipment includes a main body including a bonding head, a head heater at a bottom of the bonding head, the head heater including a thermal compression surface, negative pressure channels recessed from the thermal compression surface and the negative pressure channels including first holes therein, and a bonding tool including a first surface, a second surface, grooves at the first surface, the first surface configured to contact the thermal compression surface, the second surface being opposite to the first surface and configured to contact a semiconductor chip for thermal compression, wherein the grooves are in communication with the negative pressure channels so that the negative pressure supplied to the first holes is applied to the negative pressure channels and the grooves together.

According to an example embodiment of the present inventive concepts, semiconductor manufacturing equipment includes a main body including a bonding head, a head heater at a bottom of the bonding head, the head heater including a thermal compression surface, negative pressure channels recessed from the thermal compression surface and the negative pressure channels including first holes therein, and a bonding tool including a first surface, a second surface, and grooves at the first surface, the first surface configured to contact the thermal compression surface, the second surface being opposite the first surface and configured to contact a semiconductor chip for thermal compression, wherein the thermal compression surface has a rectangular shape and has a shape in which a portion extending inwardly from a pair of opposite edges in the rectangular shape of the thermal compression surface is removed, and the grooves are in communication with the negative pressure channels so that the negative pressure supplied to the first holes is applied to the negative pressure channels and the grooves together.

According to an example embodiment of the present inventive concepts, semiconductor manufacturing equipment includes a main body including a bonding head, a head heater at a bottom of the bonding head, the head heater including a thermal compression surface, negative pressure channels recessed from the thermal compression surface and the negative pressure channels including first holes therein, and a bonding tool including a first surface, a second surface, and grooves at the first surface, the first surface configured to contact the thermal compression surface, the second surface being opposite the first surface and configured to contact a semiconductor chip for thermal compression, wherein boundaries of the grooves on the first surface are within corresponding boundaries of the negative pressure channels on the thermal compression surface in a plan view so that the negative pressure supplied to the first holes is applied to the negative pressure channels and the grooves together, the boundaries of the grooves on the first surface are configured to contact the thermal compression surface, each of the boundaries of the negative pressure channels and a corresponding one of the boundaries of the grooves are spaced apart by a first interval in a range between 0.1 mm and 2 mm, and vertices of the grooves on the first surface are rounded, the vertices of the grooves being points at which two edges of the boundaries of the grooves meet each other, and a vertical level difference between bottom surfaces of the grooves horizontal to the first surface and the first surface is constant.

BRIEF DESCRIPTION OF THE DRAWINGS

Some example embodiments will be more clearly understood from the following detailed description taken in conjunction with the accompanying drawings in which.

DETAILED DESCRIPTION

Figure 1:
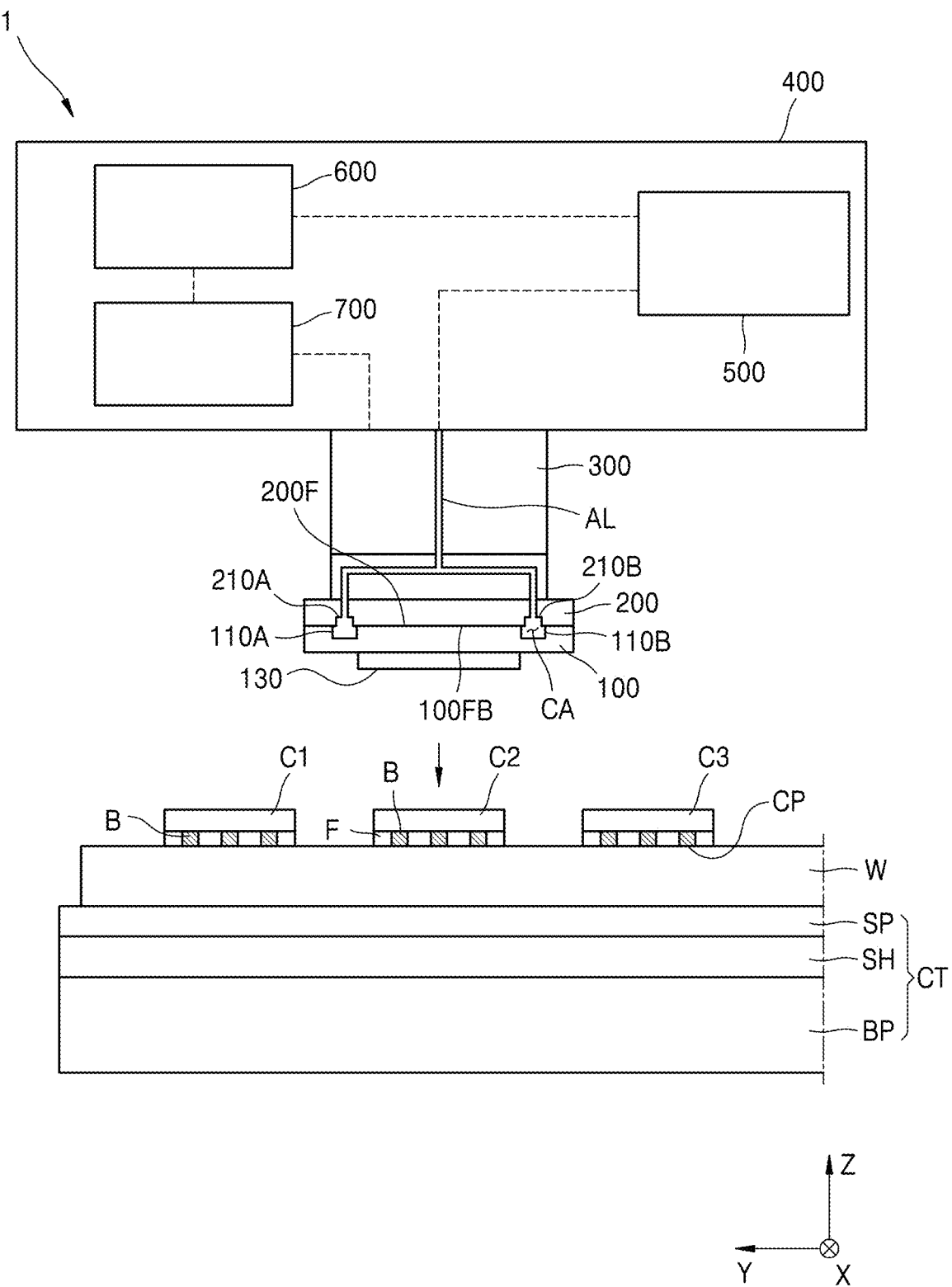
FIG. 1 is a side view schematically illustrating semiconductor manufacturing equipment.

Hereinafter, some example embodiments of the present disclosure will be described in detail with reference to the accompanying drawings. The same reference numerals are used for the same components in the drawings, and redundant description thereof is omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
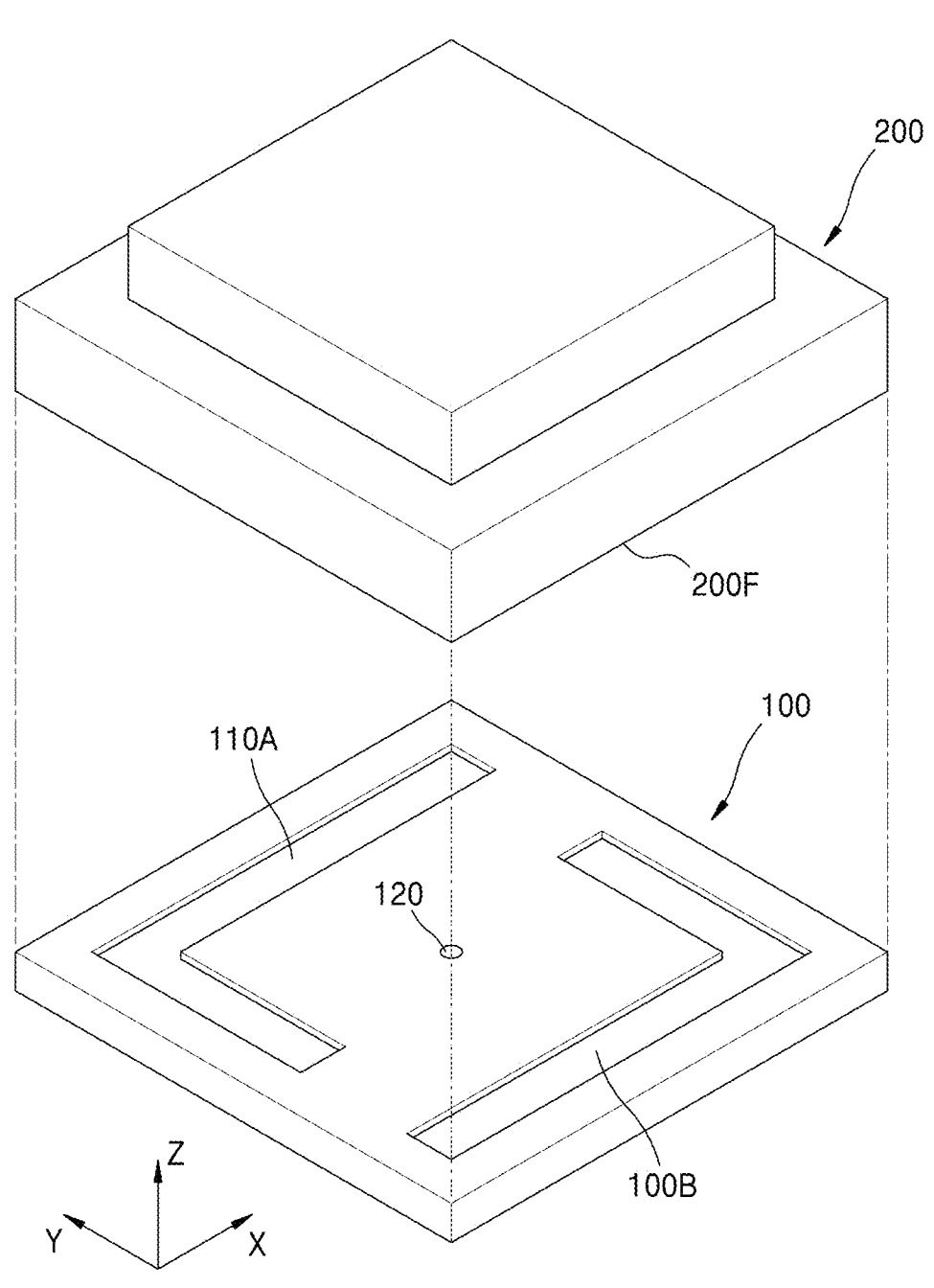
FIG. 2 is a perspective view schematically illustrating a head heater and a bonding tool constituting semiconductor manufacturing equipment according to an example embodiment of the present inventive concepts.

FIG. 1 is a side view schematically illustrating semiconductor manufacturing equipment 1 according to an example embodiment of the present inventive concepts. FIG. 2 is a perspective view schematically illustrating a head heater and a bonding tool constituting semiconductor manufacturing equipment 1.

Referring to FIGS. 1 and 2, the semiconductor manufacturing equipment 1 according to an example embodiment of the present inventive concepts is chip bonding equipment that bonds and mounts semiconductor chips C1, C2 and C3 onto a substrate W (e.g., a wafer).

The semiconductor manufacturing equipment 1 may comprise a main body 400 including a controller 600 and a driver 700, a bonding head 300 disposed at the bottom of the main body 400, a head heater 200 disposed at the bottom of the bonding head 300, and a bonding tool 100. The bonding tool 100 may include a first surface 100FB in contact with a thermal compression surface 200F, which is the lower surface of the head heater 200, and a second surface 130 facing (or to be in contact with) the semiconductor chips C1, C2 and C3.

The semiconductor manufacturing equipment 1 may comprise the bonding tool 100 including grooves 110A and 110B on one side of the semiconductor chips C1, C2, and C3 for thermal compression by transferring heat and pressure. The semiconductor manufacturing equipment 1 may comprise the head heater 200 that includes negative pressure channels 210A and 210B provided on the thermal compression surface 200F opposite to (or facing) the first surface 100FB, which is a top of the bonding tool 100, and transfers heat by contacting the bonding tool 100. The thermal compression surface 200F may be disposed in contact with the first surface 100FB of the bonding tool 100 so that the negative pressure channels 210A and 210B provided in the head heater 200 communicate with the grooves 110A and 110B provided in the bonding tool 100.

The semiconductor manufacturing equipment 1 may comprise the bonding head 300 connected to an upper end of the head heater 200 to transmit pressure to the bonding tool 100.

The semiconductor manufacturing equipment 1 may comprise an air supply line AL passing through the head heater 200 and the bonding head 300. The air supply line AL may be connected to the negative pressure channels 210A and 210B to inject or exhaust air into the negative pressure channels 210A and 210B. The main body 400 may further comprise a pressure controller 500 capable of adjusting air pressure in a cavity CA through the air supply line AL, wherein the cavity CA is a space formed by communicating the negative pressure channels 210A and 210B and the grooves 110A and 110B. In the present description, negative pressure refers to pressure lower than ambient or atmospheric pressure.

The substrate W to which the semiconductor chips C1, C2, and C3 are bonded may be placed on a stage, such as a chuck table CT. In an example embodiment, the substrate W may be subjected to a chemical mechanical polishing process so that the connection port CP is exposed on a mounting surface to which the semiconductor chips C1, C2, and C3 are attached.

The stage CT may comprise a base plate BP, a stage heater SH for heating the substrate W to a desired (or alternatively, predetermined) temperature, and a stage plate SP disposed on the stage heater SH and on which the substrate W is seated.

Solder bumps B may be positioned at the bottom of the semiconductor chips C1, C2, and C3. The solder bumps B may be disposed at the bottom of the semiconductor chips C1, C2, and C3 while being fixed by a bonding film F. When the semiconductor chips C1, C2, and C3 are pressed by the bonding tool 100, the bonding film F may be melted in a bonding region where the semiconductor chips C1, C2, and C3 are bonded. The melted bonding film F may adhere the substrate W to the semiconductor chips C1, C2, and C3 by sealing between the semiconductor chips C1, C2, and C3 and the substrate W.

The bonding head 300 may be moved in the X-axis, Y-axis, and Z-axis directions by the driver 700 provided in the main body 400. The bonding tool 100 connected to a bottom of the bonding head 300 may move the bonding head 300 for sequential thermal compression of the semiconductor chips C1, C2, and C3. For example, the bonding head 300 may apply a bonding load of about 100 N to about 300 N to the bonding tool 100. The second surface 130 of the bonding tool 100 positioned opposite to the first surface 100FB may contact the semiconductor chips C1, C2, and C3 to transmit the load.

The head heater 200 may be positioned between the bonding head 300 and the bonding tool 100. The head heater 200 may transmit a load applied from the bonding head 300 to the bonding tool 100 below. The head heater 200 may include a heater (not shown) and the bonding tool 100 may be heated by the head heater 200. As an example embodiment, the head heater 200 may be a laminated ceramic heater. As an example embodiment, the head heater 200 may be heated in a range of about 25° C. to about 500° C. For example, the head heater 200 may be heated to a temperature of about 300° C. When the head heater 200 is heated, the second surface 130 may contact the semiconductor chips C1, C2, and C3 to transfer heat.

The bonding tool 100 may move up and down according to the movement of the bonding head 300 for sequential thermal compression of the semiconductor chips C1, C2 and C3 disposed on the substrate W. The bonding tool 100 may electrically connect the semiconductor chips C1, C2, and C3 to the connection port CP of the substrate W by heating the semiconductor chips C1, C2 and C3 and melting the solder bumps B disposed at the bottom of the semiconductor chips C1, C2, and C3.

The bonding process described above is a die-to-wafer bonding process for bonding a semiconductor chip and a substrate. However, semiconductor manufacturing equipment according to an example embodiment of the present inventive concepts may also be applied to a wafer-to-wafer bonding process for bonding two wafers and a chip-to-chip bonding process for bonding two chips. The bonding process to which the semiconductor manufacturing equipment 1 of the present inventive concepts may be applied is not limited to the example embodiments described herein.

A bonding process using the semiconductor manufacturing equipment 1 may be controlled by the controller 500 provided in the main body 400. The controller 500 may be implemented in hardware, firmware, software, or any combination thereof. For example, the controller 500 may be a computing device, such as a workstation computer, a desktop computer, a laptop computer, or a tablet computer. For example, the controller 500 may include a memory device, such as read only memory (ROM) and random access memory (RAM), and a processor configured to perform desired (or alternatively, predetermined) operations and algorithms, such as a microprocessor, a central processing unit (CPU), a graphics processing unit (GPU), and the like. In addition, the controller 500 may include a receiver and a transmitter for receiving and transmitting electrical signals.

Figure 3:
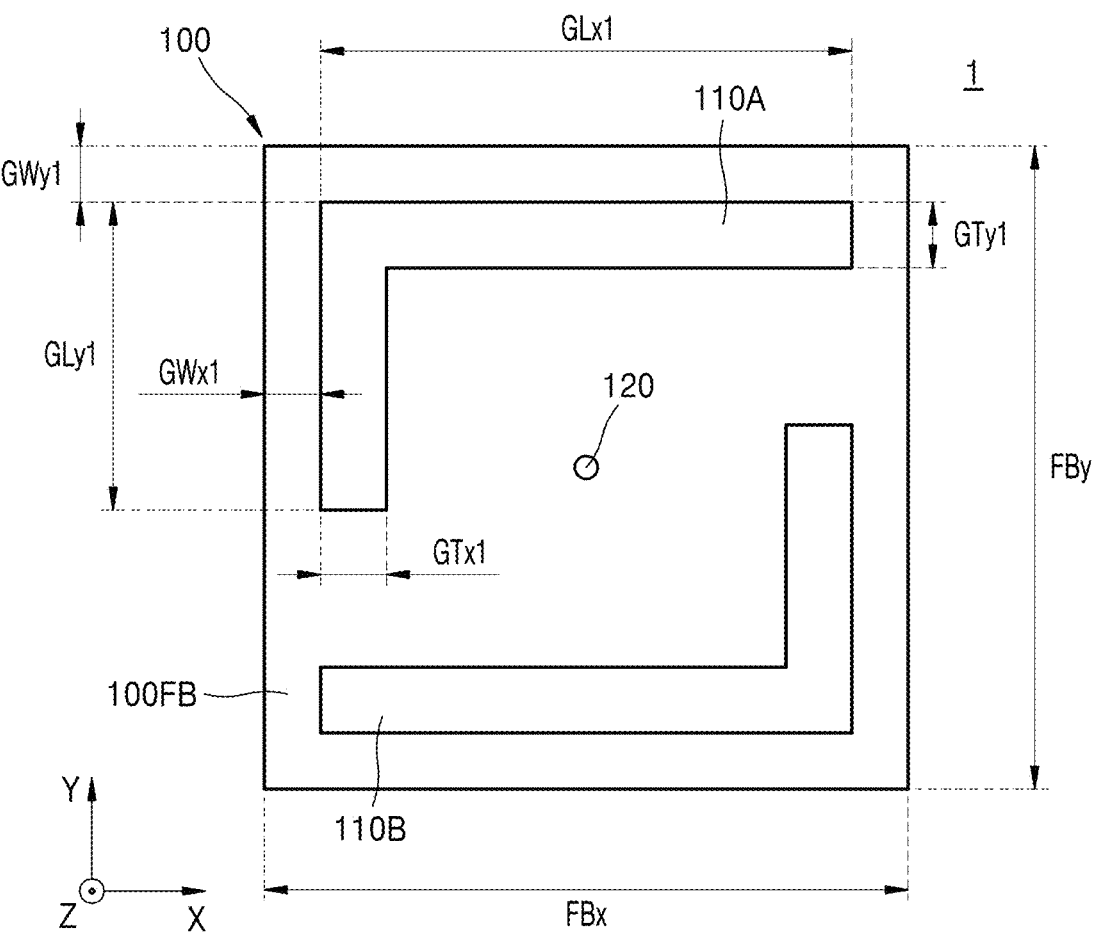
FIG. 3 is a plan view illustrating a bonding tool constituting semiconductor manufacturing equipment according to an example embodiment of the present inventive concepts.

FIG. 3 is a plan view illustrating a bonding tool 100 constituting the semiconductor manufacturing equipment 1 according to an example embodiment of the present inventive concepts. Referring to FIG. 3, the bonding tool 100 may include a first groove 110A and a second groove 110B that are provided in the first surface 100FB, which is one of the surfaces of the bonding tool 100, a center hole 120 provided at the center of the first surface 100FB, and a second surface (not shown) in contact with a semiconductor chip for bonding opposite to the first surface FB.

The first groove 110A and the second groove 110B may be provided in the first surface 100FB of the bonding tool 100, which faces the thermal compression surface 200F of the head heater 200. As shown in FIG. 2, the first groove 110A and the second groove 110B are recessed from the first surface 100FB so that the bottom surfaces of the grooves 110A and 110B may be configured to have a vertical (Z-axis direction) level difference from the first surface 100FB.

With respect to the center hole 120A, a first groove 110A disposed in a +Y-axis direction and a second groove 110B disposed in a −Y-axis direction may be provided in the first surface 100FB. The first groove 110A and the second groove 110B may be symmetrically disposed with respect to the center hole 120. The center hole 120 may be used to identify or fix the center of the bonding tool 100. As an example embodiment, the center hole 120 may have a diameter of about 0.5 mm and a depth recessed from the first surface 100 FB of about 0.3 mm.

The first groove 110A may be recessed from the first surface 100FB so that the bottom surface of the first groove 110A and the first surface 100FB may have a vertical (Z-axis direction) level difference. The bottom surface of the recessed first groove 110A may have a certain level difference from the first surface 100FB.

The planar shape of the first surface 100FB may be a quadrangle. In some example embodiments, the planar shape of the first surface 100FB may be square or rectangular. In the present description, a case in which the planar shape of the first surface 100FB is a rectangle or a square is described as an example, but semiconductor manufacturing equipment according to the present inventive concepts are not limited thereto.

Among the edges (e.g., sides) of the first surface 100FB, a pair of edges (e.g., sides) extending in the X-axis direction and parallel to each other may be referred to as horizontal sides of the first surface 100FB. The horizontal sides of the first surface 100FB may be parallel to the X-axis direction. Among the edges (e.g., sides) of the first surface 100FB, a pair of edges (e.g., sides) extending in the Y-axis direction and parallel to each other may be referred to as vertical sides of the first surface 100FB. The vertical sides of the first surface 100FB may be parallel to the Y-axis direction.

For example, the horizontal side length FBx of the first surface 100FB may be the same as or different from the vertical side length FBy of the first surface. For example, the horizontal side length FBx of the first surface 100FB may be configured to be about 12 mm or more and about 18 mm or less, and the vertical side length FBy of the first surface 100FB May be 12 mm or more and about 18 mm or less. For example, the horizontal side length FBx of the first surface 100FB may be about 16 mm and the vertical side length FBy of the first surface 100FB may be about 16 mm.

The first groove 110A may be spaced apart from one of the edges extending in the Y-axis direction of the first surface 100FB by a first X-axis gap GWx1 in the X-axis direction. As an example embodiment, one of the edges extending in the Y-axis direction forming the boundary of the first groove 110A is spaced apart from and parallel to one of the edges extending in the Y-axis direction of the first surface 100FB by a first x-axis gap GWx1.

The first groove 110A may be spaced apart from one of the edges extending in the X-axis direction of the first surface 100FB by a first Y-axis gap GWy1 in the Y-axis direction. The first groove 110A may be spaced apart from and parallel to one of the edges extending in the X-axis direction of the first surface 100FB by a first Y-axis gap GWy1. As an example embodiment, the first Y-axis gap GWy1 may be greater than or equal to about 0.5 mm and less than or equal to about 2 mm. For example, the first Y-axis gap GWy1 may be about 1 mm.

The first groove 110A may be spaced apart from one of the edges extending in the Y-axis direction of the first surface 100FB by a first X-axis gap GWx1 in the X-axis direction. The first groove 110A may be spaced apart from and parallel to one of the edges extending in the Y-axis direction of the first surface 100FB by the first X-axis gap GWx1. As an example embodiment, the first X-axis gap GWx1 may be greater than or equal to about 0.5 mm and less than or equal to about 2 mm. For example, the first X-axis gap GWx1 may be about 1 mm.

As an example embodiment of the present inventive concepts, the first groove 110A may have an 'L-shaped' planar shape and may be provided in the first surface 110FB. A portion protruding outward from a bent portion of the first groove 110A may be disposed close to one of the vertices of the first surface 100FB. In other words, an outward point of the bent portion of the first groove 110A may be close to one of the vertices of the first surface 100FB. The two extensions of the first groove 110A each extending from the bent portion of the first groove 110A may be configured to be parallel to the X axis or the Y axis. Two extensions of the first groove 110A may meet at right angles with each other.

The length of the first groove X-axis extension extending in the X-axis direction among the extensions of the first groove 110A may have a first x-axis length GLx1, and the length of the first groove Y-axis extension extending in the Y-axis direction among the extensions of the first groove 110A may have the first Y-axis length GLy1. The first X-axis length GLx1 is less than the horizontal side length FBx of the first surface 100FB (e.g., the length of the first surface 100FB in the X-axis direction). The first Y-axis length GLy1 is less than the vertical side length FBy of the first surface 100FB (e.g., the length of the first surface 100FB in the Y-axis direction).

The first X-axis length GLx1 may be equal to or greater than the first Y-axis length GLy1. The first X-axis length GLx1 may be less than the horizontal side length FBx of the first surface 100FB, and the difference between the horizontal side length FBx of the first surface 100FB and the first X-axis length GLx1 may be twice the first X-axis gap GWx1. That is, the first groove X-axis extension extending in the X-axis direction of the first groove 110A may be spaced apart from one of the vertical edges extending in the Y-axis of the first surface 100FB by the first X-axis gap GWx1. As an example embodiment, the first X-axis length GLx1 may be about 10 mm or more and about 15 mm or less, and the first Y-axis length GLy1 may be about 6 mm or more and about 10 mm or less. For example, the first X-axis length GLx1 may be about 14 mm, and the first Y-axis length GLy1 may be about 8.2 mm.

A detailed description of the width GTy1 of the first groove X-axis extension and the width GTx1 of the first groove Y-axis extension will be provided later. The second groove 110B may be positioned in the first surface 100FB symmetrically to the first groove 110A with respect to the center hole 120 or the center of the first surface 100FB. A description of the second groove 110B is omitted as the description thereof is the same as or substantially similar to that of the first groove 110A.

Figure 4A:
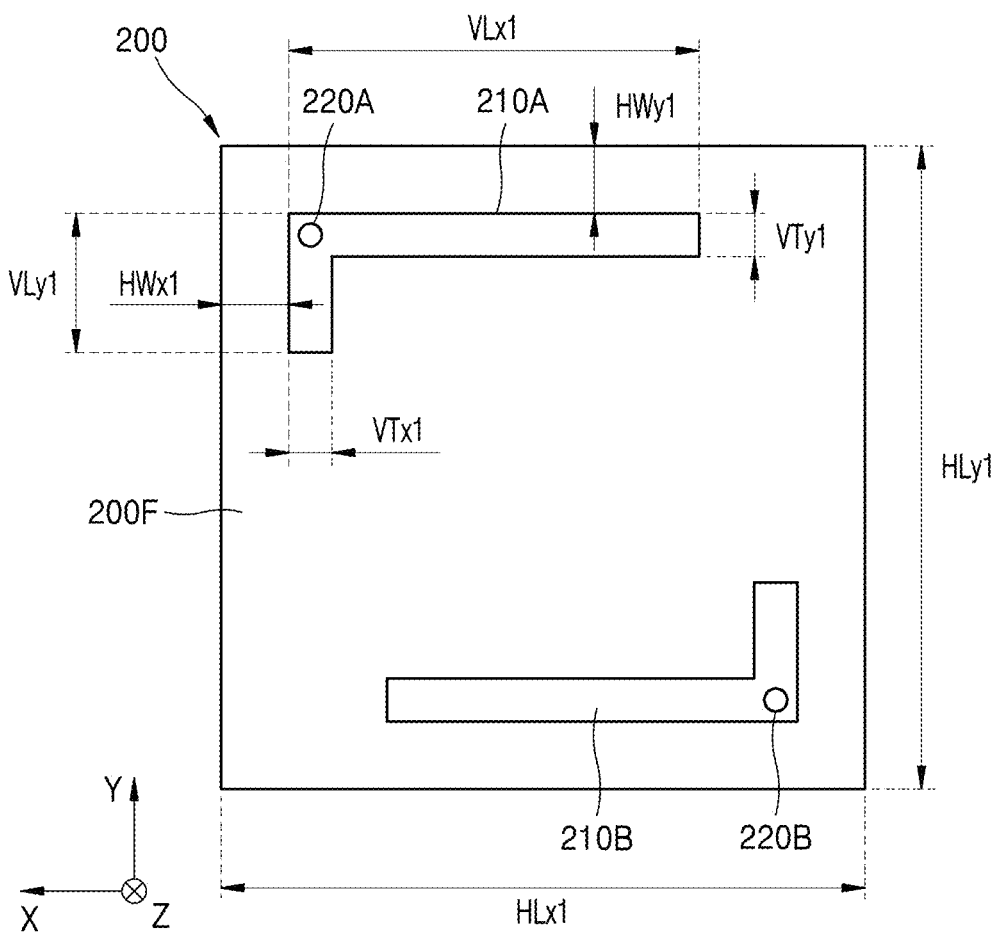
FIG. 4A is a plan view illustrating a head heater constituting semiconductor manufacturing equipment according to an example embodiment of the present inventive concepts.

FIG. 4A is a plan view illustrating a head heater constituting semiconductor manufacturing equipment according to an example embodiment of the present inventive concepts.

Figure 4B:
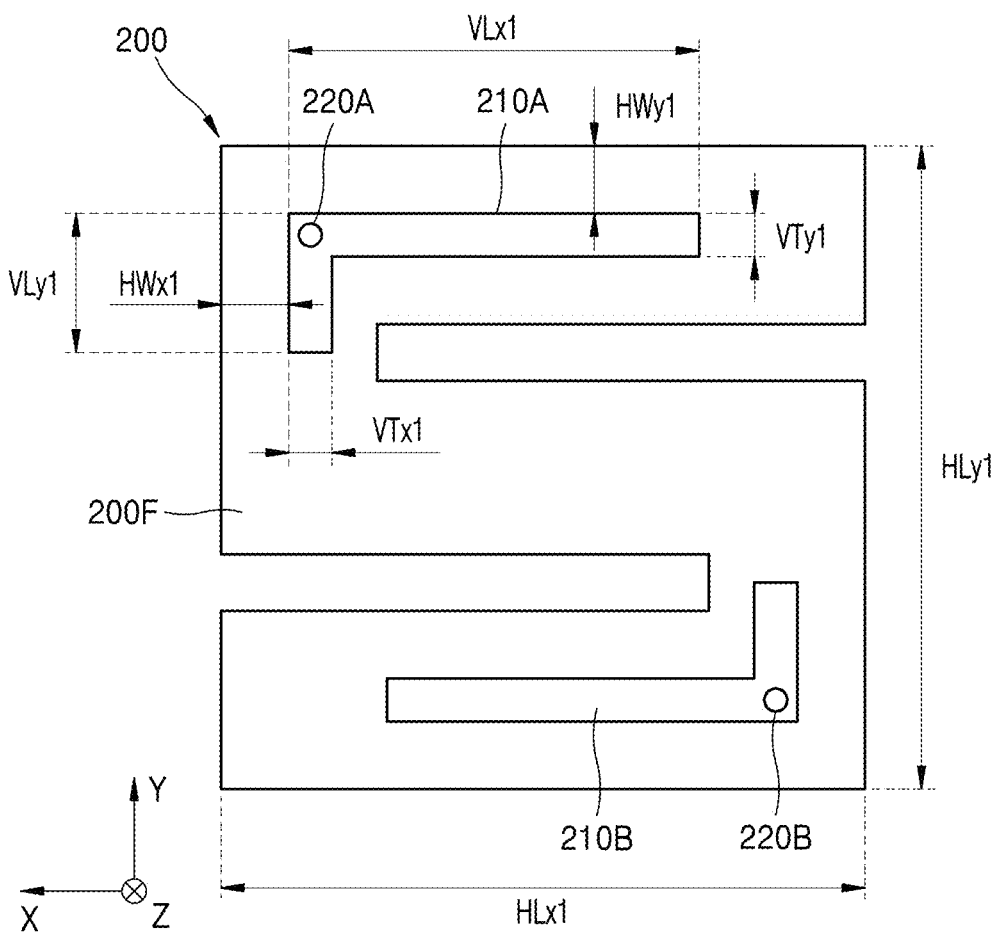
FIG. 4B is a plan view illustrating a head heater included in semiconductor manufacturing equipment according to an example embodiment of the present inventive concepts.

FIG. 4B is a plan view illustrating a head heater constituting semiconductor manufacturing equipment according to an example embodiment of the present inventive concepts.

Referring to FIGS. 4A and 4B, the head heater 200 may include negative pressure channels 210A and 210B provided on a thermal compression surface 200F facing the first surface 100FB of the bonding tool 100, and negative pressure holes 220A and 220B provided in the negative pressure channels 210A and 210B.

As an example embodiment, the negative pressure channels 210A and 210B may be provided on the thermal compression surface 200F, which is a lower surface of the head heater 200. The negative pressure channels 210A and 210B may be recessed from the thermal compression surface 200F so that the undersides (e.g., bottom surfaces) of the negative pressure channels 210A and 210B have a vertical (Z-axis direction) level difference from the thermal compression surface 200F.

One or more negative pressure channels 210A and 210B may be provided on the thermal compression surface 200F. With respect to the thermal compression surface 200F, the first negative pressure channel 210A disposed in the +Y-axis direction and the second negative pressure channel 210B disposed in the –Y-axis direction relative to the first negative pressure channel 210A may be provided on the thermal compression surface 200F. The first negative pressure channel 210A and the second negative pressure channel 210B may be symmetrically disposed with respect to the center of the thermal compression surface 200F.

The first negative pressure channel 210A may be recessed from the thermal compression surface 200F so that the underside (e.g., bottom surface) of the first negative pressure channel 210A may have a vertical (Z-axis direction) level difference from the thermal compression surface 200F. The underside (e.g., bottom surface) of the first negative pressure channel 210A may have a constant vertical (Z-axis direction) level difference from the thermal compression surface 200F.

The planar shape of the thermal compression surface 200F may be a quadrangle as shown in FIG. 4B as a whole. As an example embodiment, the planar shape of the thermal compression surface 200F may be square or rectangular as a whole. In the description, a case in which the planar shape of the first surface 100FB is a rectangle or a square is described as an example, but example embodiments are not limited thereto. Among the edges of the thermal compression surface 200F, a pair of edges extending in the x-axis direction and parallel to each other may be referred to as horizontal sides of the thermal compression surface 200F. The horizontal sides of the thermal compression surface 200F may be parallel to the X-axis direction. Among the edges of the thermal compression surface 200F, a pair of edges extending in the Y-axis direction and parallel to each other may be referred to as vertical sides of the thermal compression surface 200F.

The vertical side of the thermal compression surface 200F may be parallel to the Y-axis direction. For example, the horizontal side length HLx1 of the thermal compression surface 200F may be the same as or different from the vertical side length HLy1 of the thermal compression surface.

The first negative pressure channel 210A may be spaced apart from one of the edges extending in the Y-axis direction of the thermal compression surface 200F by the first X-axis channel gap HWx1 in the X-axis direction. In an example embodiment, one of the edges extending in the Y-axis direction forming the boundary of the first negative pressure channel 210A may be spaced apart from one of the edges extending in the Y-axis direction of the thermal compression surface 200 at regular intervals by the first X-axis channel gap HWx1. One of the edges extending in the Y-axis direction forming the boundary of the first negative pressure channel 210A may be parallel to one of the edges extending in the Y-axis direction of the thermal compression surface 200F.

The first negative pressure channel 210A may be spaced apart from one of the edges extending in the X-axis direction of the thermal compression surface 200F by the first Y-axis channel gap HWy1 in the Y-axis direction. In an example embodiment, one of the edges extending in the X-axis direction forming the boundary of the first negative pressure channel 210A may be spaced apart from one of the edges extending in the X-axis direction of the thermal compression surface 200F at regular intervals by the first Y-axis channel gap HWy1. One of the edges extending in the X-axis direction forming the boundary of the first negative pressure channel 210A may be parallel to one of the edges extending in the X-axis direction of the thermal compression surface 200F.

As an example embodiment of the present inventive concepts, the first negative pressure channel 210A may have an 'L-shaped' planar shape and may be provided on the thermal compression surface 200F. A portion protruding outward from a bent portion of the first negative pressure channel 210A may be disposed close to one of the vertices of the thermal compression surface 200F. In other words, an outward point of the bent portion of the first negative pressure channel 210A may be close to one of the vertices of the first thermal compression surface 200F. The two extensions of the first negative pressure channel 210A each extending from the bent portion of the first negative pressure channel 210A may be configured to be parallel to the X axis or the Y axis. Two extensions of the first negative pressure channel 210A may meet at right angles.

The length of the X-axis extension extending in the X-axis direction among the extensions of the first negative pressure channel 210A may have a channel X-axis length VLx1, and the length of the Y-axis extension extending in the Y-axis direction among the extensions may have a channel Y-axis length VLy1. The channel X-axis length VLx1 is less than the horizontal side length HLx1 of the thermal compression surface 200F (e.g., the length of the thermal compression surface 200F in the X-axis direction). The channel Y-axis length VLy1 is less than the vertical side length HLy of the thermal compression surface 200F (e.g., the length of the thermal compression surface 200F in the Y-axis direction).

As an example embodiment, the channel X-axis length VLx1 may be equal to or greater than the channel Y-axis length VLy1. The channel X-axis length VLx1 is less than the horizontal side length HLx1 of the thermal compression surface 200F, and the difference between the horizontal side length HLx1 of the thermal compression surface 200F and the channel X-axis length VLx1 may be twice the first X-axis channel gap HWx1. The extension of the thermal compression surface 200F extending in the X-axis direction may be spaced apart from the thermal compression surface 200F in the Y-axis direction by the first X-axis channel gap HWx1.

A detailed description of the width VTy1 of the first negative pressure channel X-axis extension and the width VTx1 of the first negative pressure channel Y-axis extension will be provided later.

As shown in FIG. 4B, the thermal compression surface 200F, the outer circumference of which has the shape of a quadrangle, may be configured in a form in which a portion in a rectangular shape extending from each of the pair of vertical (Y-axis) direction edges of the quadrangle to the inside of the thermal compression surface 200F is removed. The shape of the thermal compression surface 200F is not limited to this example embodiment.

Figure 5:
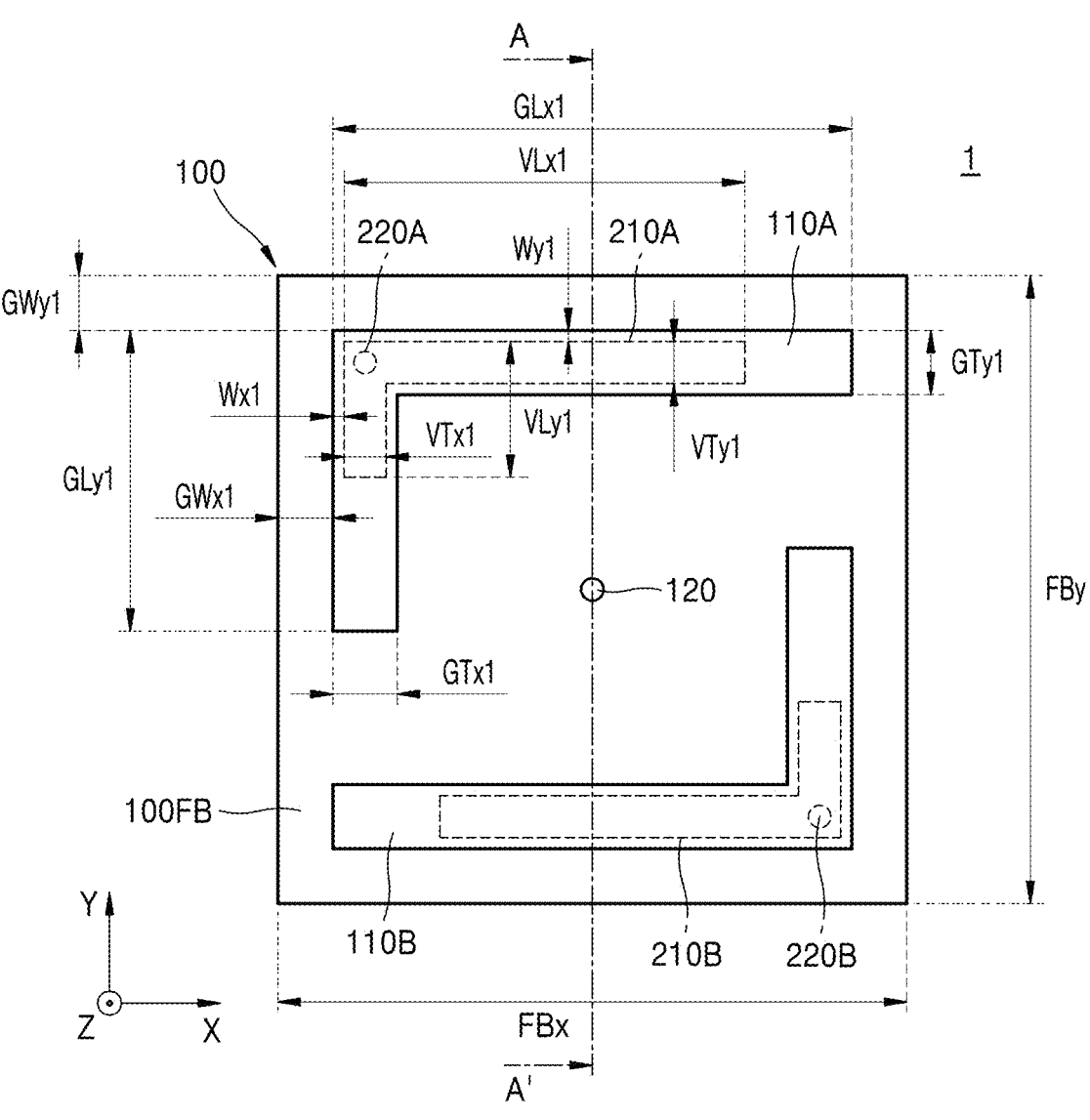
FIG. 5 is a plan view illustrating a bonding tool included in semiconductor manufacturing equipment according to an example embodiment of the present inventive concepts.
Figure 6:
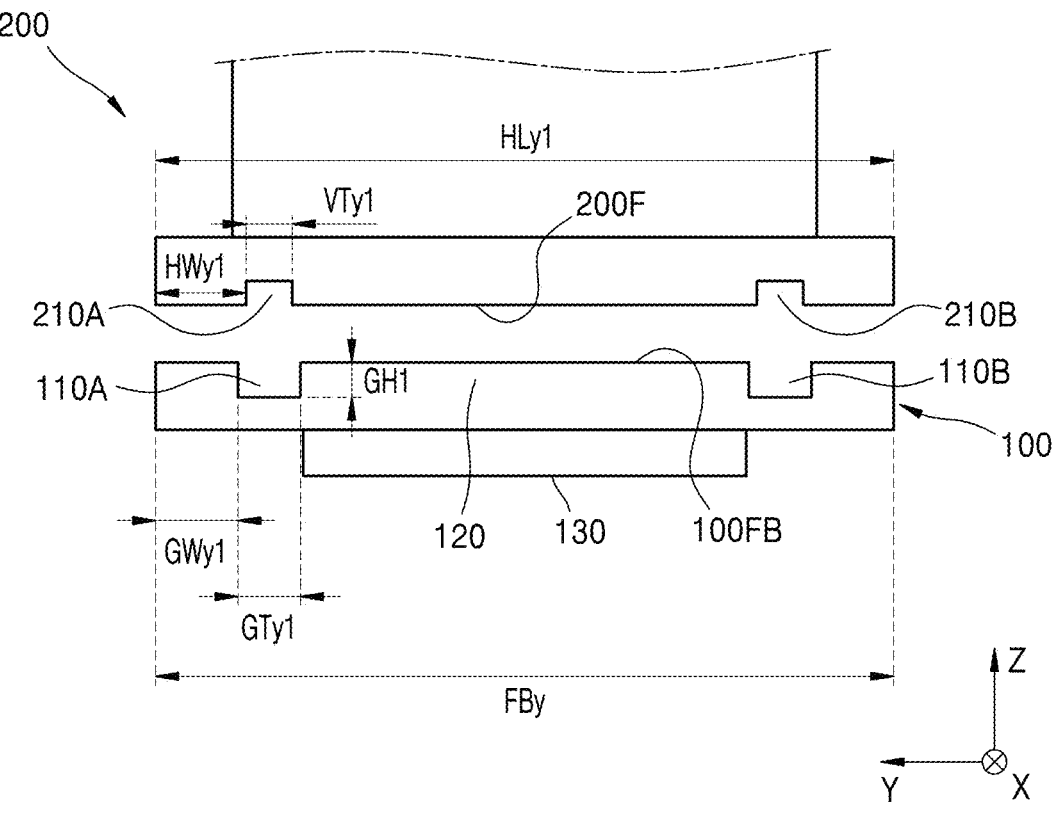
FIG. 6 is a cross-sectional side view of the bonding tool included in the semiconductor manufacturing equipment according to an example embodiment of the present inventive concepts, taken along a line from A to A' in FIG. 5.
Figure 7:
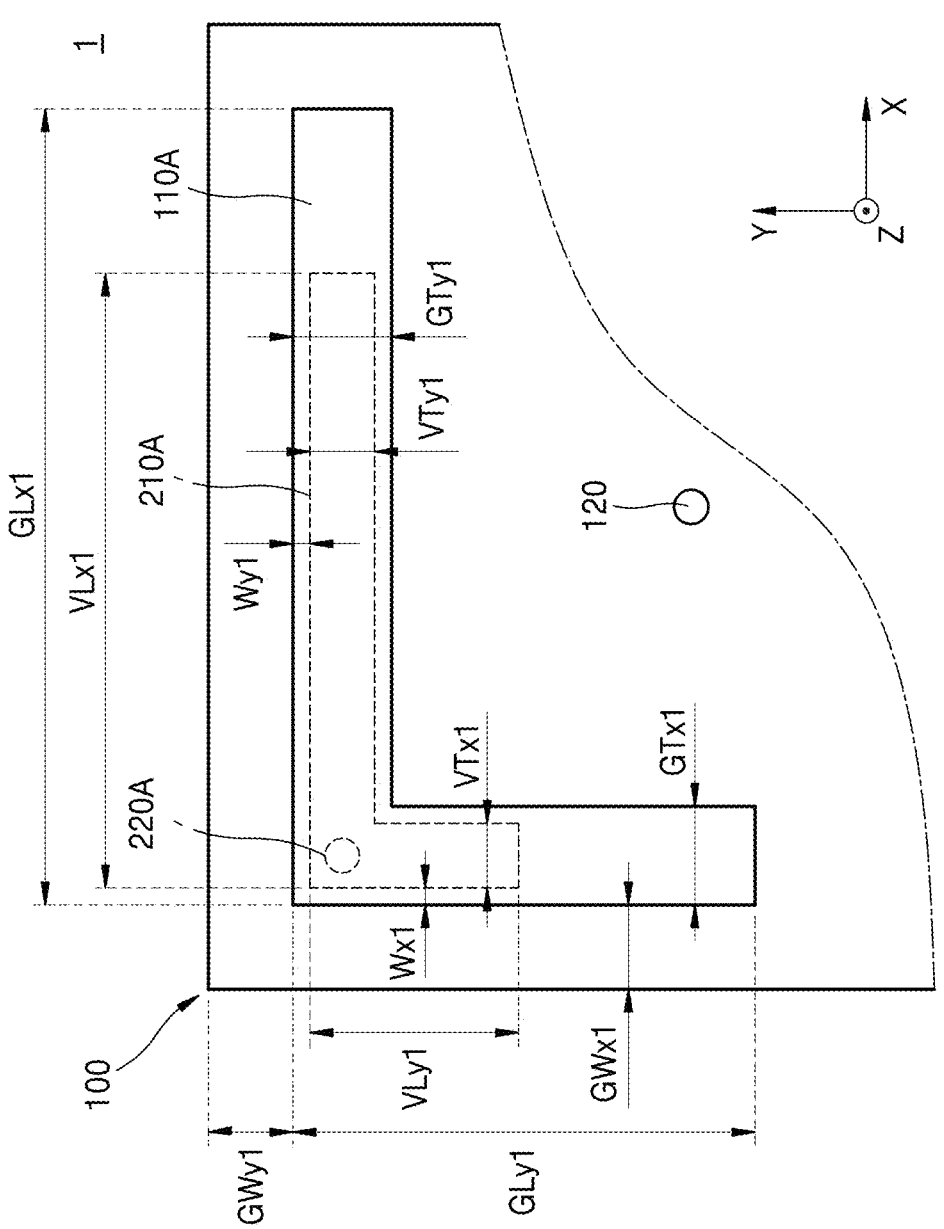
FIG. 7 is an enlarged plan view of a part of a bonding tool included in semiconductor manufacturing equipment according to an example embodiment of the present inventive concepts.

FIG. 5 is a plan view illustrating a bonding tool included in semiconductor manufacturing equipment according to an example embodiment of the present inventive concepts. FIG. 6 is a cross-sectional side view of the bonding tool included in the semiconductor manufacturing equipment according to an example embodiment of the present inventive concepts, taken along a line to A-A' in FIG. 5. FIG. 7 is an enlarged plan view of a part of a bonding tool included in semiconductor manufacturing equipment according to an example embodiment of the present inventive concepts.

Referring to FIG. 5 to FIG. 7, the first groove 110A and the second groove 110B provided in the bonding tool 100 and the first negative pressure channel 210A and the second negative pressure channel provided in the head heater 200 may be configured to contact each other. A boundary formed by the first groove 110A in the first surface 100FB may cover (or enclose in a plan view) a boundary formed by the first negative pressure channel 210A on the thermal compression surface 200F. That is, the widths GTx1 and GTy1 of the first groove 110A may be greater than the widths VTx1 and VTY1 of the first negative pressure channel 210A. As an example embodiment, the first groove 110A may be provided such that the width GTx1 of the Y-axis extension of the first groove 110A is greater than the width VTx1 of the Y-axis extension of the first negative pressure channel 210A. The first groove 110A may be provided such that the width GTy1 of the X-axis extension of the first groove 110A is greater than the width VTy1 of the X-axis extension of the first negative pressure channel 210A. For example, the first groove 110A may be provided in the first surface 100FB such that the width GTx1 of the Y-axis extension of the first groove 110A may be about 1.5 mm and the width GTy1 of the X-axis extension of the first groove 110A may be about 1.5 mm.

FIG. 5 shows the shapes of the grooves 110A and 110B provided in the first surface 100FB of the bonding tool 100 and the negative pressure channels 210A and 210B when the thermal compression surface 200F and the first surface 100FB come into contact with each other. The negative pressure channels 210A and 210B are indicated by dashed lines inside the grooves 110A and 110B. The negative pressure holes 220A and 220B provided in the negative pressure channels 210A and 210B, respectively, are indicated by circular dashed lines.

As described above, the first groove 110A may be provided so that the width GTx1 of the Y-axis extension of the first groove 110A is greater than the width VTx1 of the Y-axis extension of the first negative pressure channel 210A. The first groove 110A may be provided such that the width GTy1 of the X-axis extension of the first groove 110A is greater than the width VTy1 of the X-axis extension of the first negative pressure channel 210A. The second groove 110B and the second negative pressure channel 210B may be the same as above, and redundant descriptions thereof are omitted.

The boundary of the first groove 110A that is formed on the first surface 100FB may be configured to include and cover all of the boundary of the first negative pressure channel 210A that is formed on the thermal compression surface 200F. Accordingly, the boundary formed by the first groove 110A in the first surface 100FB comes into contact with the thermal compression surface 200F. In other words, the boundary formed by the first groove 110A in the first surface 100FB may be configured to include a boundary in a shape where the first negative pressure channel 210A overlaps the first surface 100FB.

Similar to the first groove 110A, the boundary of the second groove 110B that is formed on the first surface 100FB may be configured to include and cover all of the boundary of the second negative pressure channel 210B that is formed on the thermal compression surface 200F. Accordingly, the boundary formed by the second groove 110B on the first surface 100FB comes into contact with the thermal compression surface 200F. In other words, the boundary formed by the second groove 110B on the first surface 100FB may be configured to include a shape where the second negative pressure channel 210B overlaps the first surface 100FB.

The distance between the Y-axis extension of the first groove 110A extending in the Y-axis direction among the extensions of the first groove 110A and the Y-axis extension of the first negative pressure channel 210A extending in the Y-axis direction among the extensions of the first negative pressure channel 210A is the first X-axis gap Wx1. The first X-axis gap Wx1 may be a constant value. As an example embodiment, the first X-axis gap Wx1 may be greater than or equal to about 0.1 mm and less than or equal to about 2 mm.

The distance between the X-axis extension of the first groove 110A extending in the X-axis direction among the extensions of the first groove 110A and the X-axis extension of the first negative pressure channel 210A extending in the X-axis direction among the extensions of the first negative pressure channel 210A is the first Y-axis gap Wy1. The first Y-axis gap Wy1 may be a constant value. As an example embodiment, the first Y-axis gap Wy1 may be greater than or equal to about 0.1 mm and less than or equal to about 2 mm.

The first groove 110A and the first negative pressure channel 210A may be configured such that the first X-axis gap Wx1 and the first Y-axis gap Wy1 have the same value. The distance between the first negative pressure channel 210A and the first groove 110A may be equal to or greater than the first X-axis and Y-axis gaps Wx1 and Wy1. Descriptions of the second groove 110B and the second negative pressure channel 210B are omitted as they are the same as or substantially similar to those provided above.

As shown in FIG. 6, undersides (e.g., bottom surfaces) of the grooves 110A and 110B may have a vertical direction (Z-axis direction) level difference with regard to the first surface 100FB. The undersides of the grooves 110A and 110B may have a first height difference GH1 with regard to the first surface 100FB. The grooves 110A and 110B may be configured such that the first height difference GH1 has a constant value. As an example embodiment, the first height difference GH1 may be greater than or equal to about 0.2 mm and less than or equal to about 1 mm.

When negative pressure is applied through the first negative pressure hole 220A and the second negative pressure hole 220B, the bonding tool 100 and the head heater 200 may be attached due to the negative pressure. As described above, the cavity CA can be formed as in FIG. 1 as the negative pressure channels 210A and 210B provided in the head heater 200 communicate with the grooves 110A and 110B provided in the first surface 100FB, which is the back side of the bonding tool 100.

The pressure and the force acting on the surface on which the pressure is applied are proportional. When the applied pressure is the same, the larger the area of the surface to which the pressure is applied, the greater the force exerted by the pressure. When the negative pressure channels 210A and 210B communicate with the grooves 110A and 110B to form the cavity CA, the area to which the negative pressure is applied increases compared to when the grooves 110A and 110B are not provided in the first surface 100FB.

When the grooves 110A and 110B are not provided in the first surface 100FB, the negative pressure acts only on the area on the first surface 100FB that corresponds to the shape of the negative pressure channels 210A and 210B. Therefore, compared to when the grooves 110A and 110B are provided in the first surface 100FB, the adhesion of the bonding tool to the head heater due to negative pressure may be small or insufficient. Due to insufficient or small adhesion, the bonding tool may be detached from the head heater in the bonding process.

In addition, when the grooves 110A and 110B are not provided in the first surface 100FB, the negative pressure applied to the negative pressure channels 210A and 210B may leak because the first surface 100FB is flat. When the negative pressure applied to the negative pressure channels 210A and 210B leaks out, the adhesion of the bonding tool to the head heater due to negative pressure decreases. Due to insufficient or small adhesion, the bonding tool may be detached from the head heater in the bonding process.

When the bonding tool is detached from the head heater, the process may be delayed. In addition, product defects may occur in the bonding process due to unstable fixation of the bonding tool to the head heater.

When a bonding tool is fixed to a head heater by adding a separate holder, process delay may occur due to a long time desired to properly position the bonding tool through the holder. Product defects may occur in the bonding process due to an error occurring in positioning the bonding tool through the holder.

In semiconductor manufacturing equipment according to an example embodiment of the present inventive concepts, grooves 110A and 110B may be provided in the first surface 100FB of the bonding tool 100. As described above, due to the grooves 110A and 110B, an area to which the negative pressure applied through the negative pressure channels 210A and 210B acts may increase. Even though negative pressure is equally applied, because the area to which the negative pressure is applied increases, the adhesion of a bonding tool to a head heater may increase. Through increased adhesion between the bonding tool 100 and the head heater 200, defects in the bonding process may be reduced and stability of the bonding process may be improved. In addition, the speed of the semiconductor chip bonding process is improved, and the application of the present inventive concepts is easy because an existing facility can be used as the bonding tool is by replacing the bonding tool in the existing facility.

Figure 8:
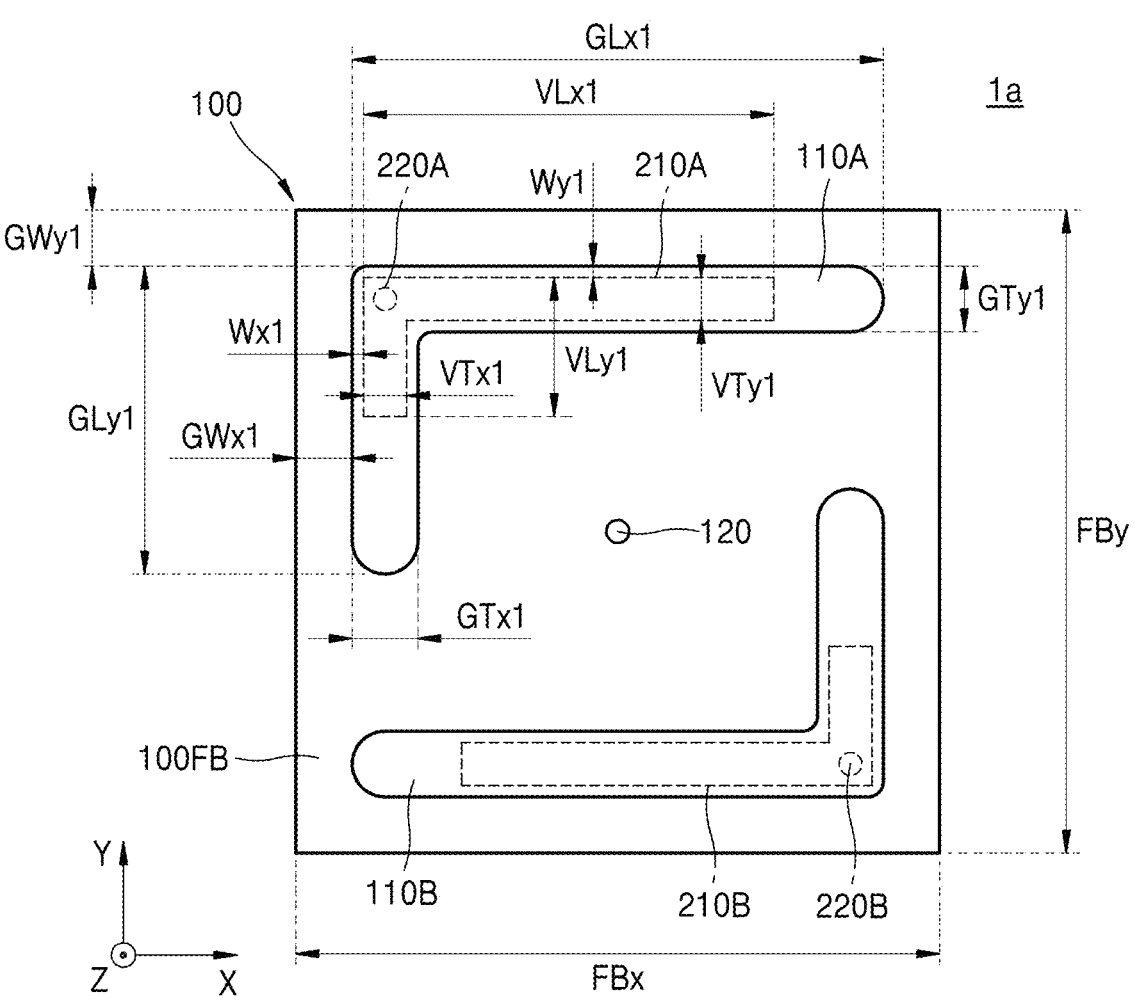
FIG. 8 is a plan view illustrating a bonding tool included in semiconductor manufacturing equipment according to an example embodiment of the present inventive concepts.

FIG. 8 is a plan view illustrating a bonding tool included in semiconductor manufacturing equipment 1a according to an example embodiment of the present inventive concepts. Description that is the same as or substantially similar to the previous description is omitted. Referring to FIG. 8, the shape of the grooves 100A and 100B provided in the first surface 100FB of the bonding tool 100 may be an 'L-shaped' planar shape as described with reference to FIGS. 2 to 7. However, both ends of the grooves 100A, 100B may be rounded in a semicircular shape. Both the inner and outer sides of the bent portions of the grooves 100A and 100B may be formed as notches. In other words, both the inner and outer sides of the bent portions of the grooves 100A and 100B also may be curved.

The second groove 110B may be positioned in the first surface 100FB symmetrically to the first groove 110A with respect to the center hole 120 or the center of the first surface 100FB and repeated descriptions are omitted.

The bonding tool 100 of the semiconductor manufacturing equipment 1a according to an example embodiment of the present inventive concepts includes grooves 110A and 110B but does not include angled vertices in the grooves 110A and 110B. Thus, the possibility that the negative pressure formed in the cavity CA by the negative pressure holes 220A and 220B will be reduced due to external air introduced through the angled vertices may be reduced. In other words, the vertices formed by the meeting of boundaries of the grooves 110A and 110B (e.g., the vertices being points at which two edges of the boundaries of the grooves 110A and 110B meet each other) are rounded, thereby reducing the possibility that sound pressure is reduced. That is, the adhesion of a bonding tool 100 to a head heater 200 is improved and maintained longer because negative pressure is kept relatively constant. This may reduce the detachment between the bonding tool 100 and the head heater 200, thereby reducing defects in the bonding process and improving the stability of the bonding process.

Figure 9:
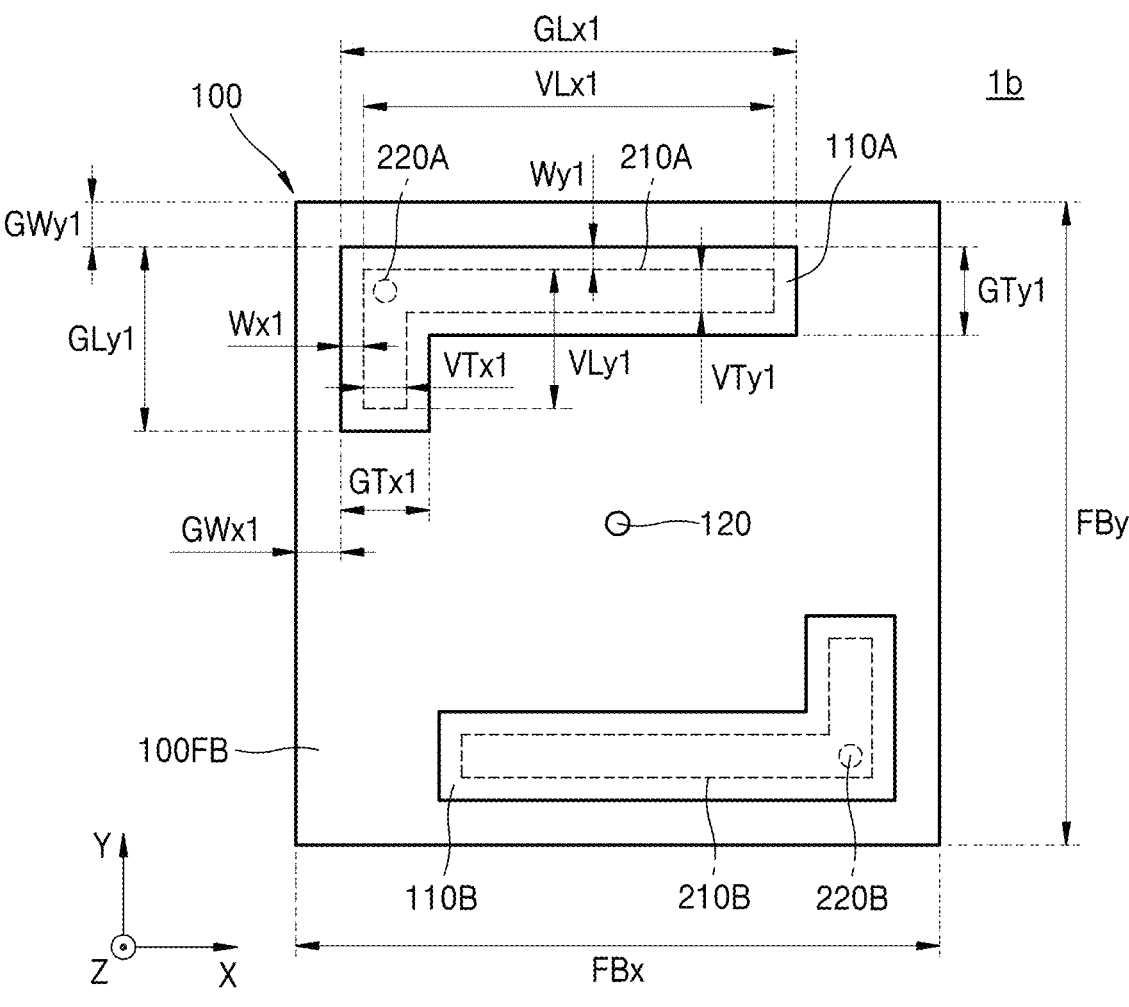
FIG. 9 is a plan view illustrating a bonding tool included in semiconductor manufacturing equipment according to an example embodiment of the present inventive concepts.

FIG. 9 is a plan view illustrating a bonding tool included in semiconductor manufacturing equipment 1b according to an example embodiment of the present inventive concepts. Referring to FIG. 9, the gap in a plan view between the boundary formed by the first groove 110A and the boundary formed by the first negative pressure channel 210A may have the same value. That is, the first X-axis gap Wx1 and the first Y-axis gap Wy1 may have the same value.

As an example embodiment, the negative pressure channels 210A may have an 'L-shaped' planar shape, and the first groove 110A having an 'L-shaped' planar shape similar to the first negative pressure channel 210A may be provided in the first surface 100FB. The second groove 110B may be positioned in the first surface 100FB symmetrically to the first groove 110A with respect to the center hole 120 and repeated descriptions that are the same as or substantially similar to those of the first groove 110A are omitted.

Figure 10:
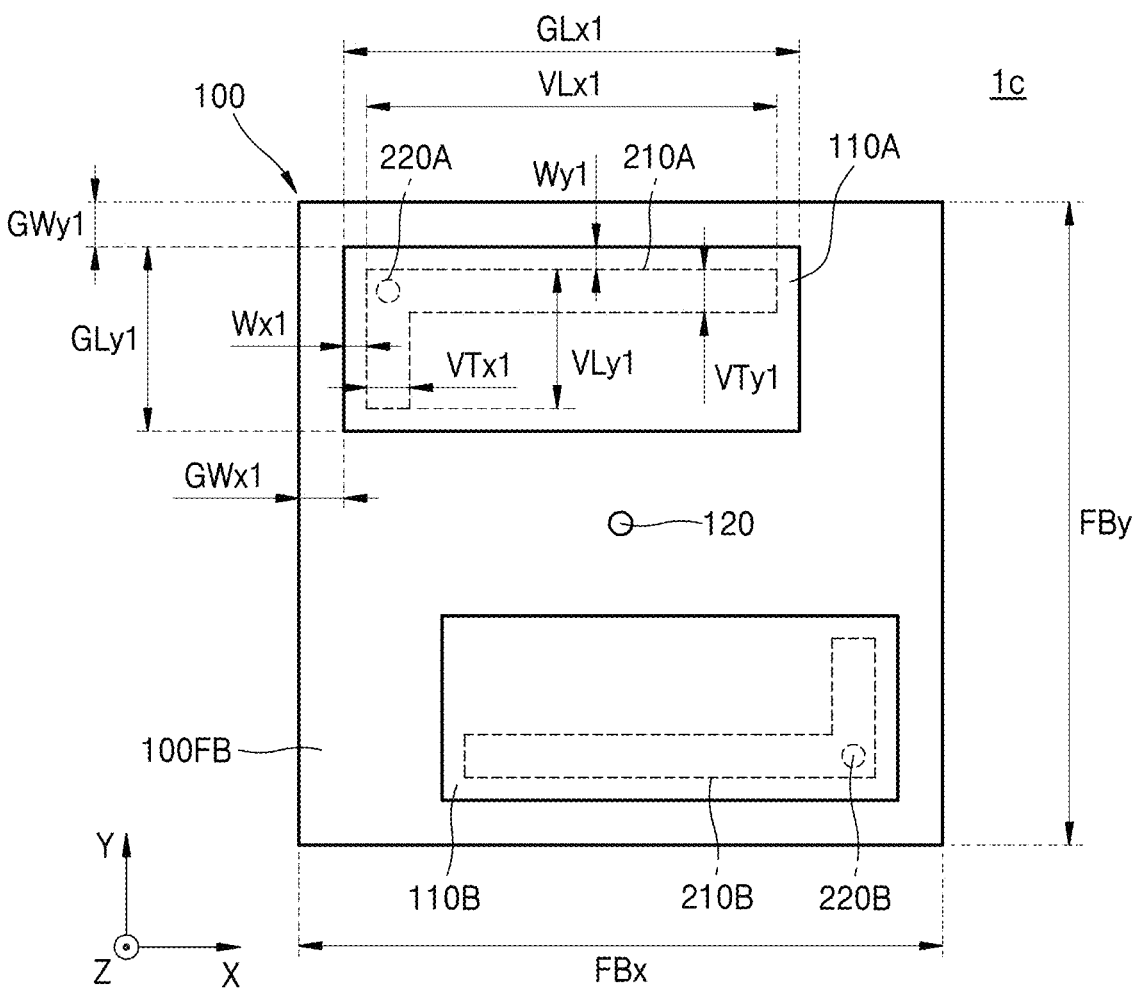
FIG. 10 is a plan view illustrating a bonding tool included in semiconductor manufacturing equipment according to an example embodiment of the present inventive concepts.

FIG. 10 is a plan view illustrating a bonding tool included in semiconductor manufacturing equipment 1c according to an example embodiment of the present inventive concepts. Referring to FIG. 10, the planar shape of the first groove 110A may be a quadrangle and be provided on the first surface 100FB. The quadrangle may be a rectangle. The boundary of the first groove 110A that is formed on the first surface 100FB may be configured to include and cover all of the boundary of the first negative pressure channel 210A that is formed on the thermal compression surface 200F. Thus, the boundary of the first groove 110A that is formed on the first surface 100FB comes into contact with the thermal compression surface 200F. In other words, the first negative pressure channel 210A overlaps the first surface 100FB, and the boundary of the first groove 110A that is formed on the first surface 100FB may be configured to include the boundary of the first negative pressure channel 210A.

Similar to the first groove 110A, the boundary of the second groove 110B that is formed on the first surface 100FB may be configured to include and cover all of the boundary of the second negative pressure channel 210B that is formed on the thermal compression surface 200F. Accordingly, the boundary of the second groove 110B that is formed on the first surface 100FB comes into contact with the thermal compression surface 200F. In other words, the second negative pressure channel 210B overlaps the first surface 100FB, and the boundary of the second groove 110B that is formed on the first surface 100FB may be configured to include the boundary of the second negative pressure channel 210B.

Figure 11:
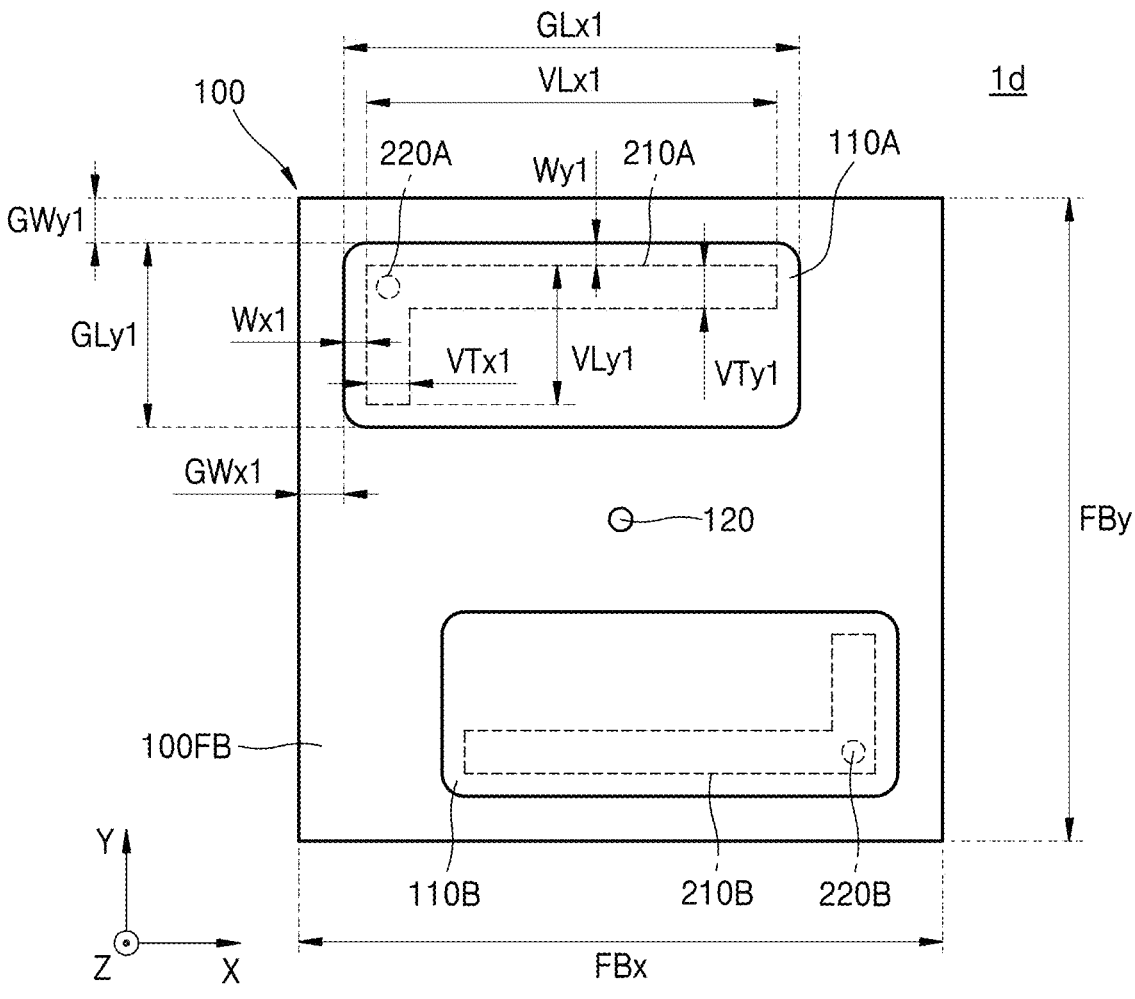
FIG. 11 is a plan view illustrating a bonding tool included in semiconductor manufacturing equipment according to an example embodiment of the present inventive concepts.

FIG. 11 is a plan view illustrating a bonding tool included in semiconductor manufacturing equipment 1d according to an example embodiment of the present inventive concepts. Referring to FIG. 11, grooves 110A and 110B in which vertices on the boundary of the rectangular grooves 110A and 110B in FIG. 10 are rounded may be provided in the first surface 100FB.

As described above, the bonding tool 100 of the semiconductor manufacturing equipment 1d according to an example embodiment of the present inventive concepts includes grooves 110A and 110B but does not include angular vertices in the grooves 110A and 110B. Thus, the adhesion of a bonding tool to a head heater is improved and maintained longer because negative pressure is kept relatively constant. This may reduce the detachment between the bonding tool and the head heater, thereby reducing defects in the bonding process and improving the stability of the bonding process.

Figure 12:
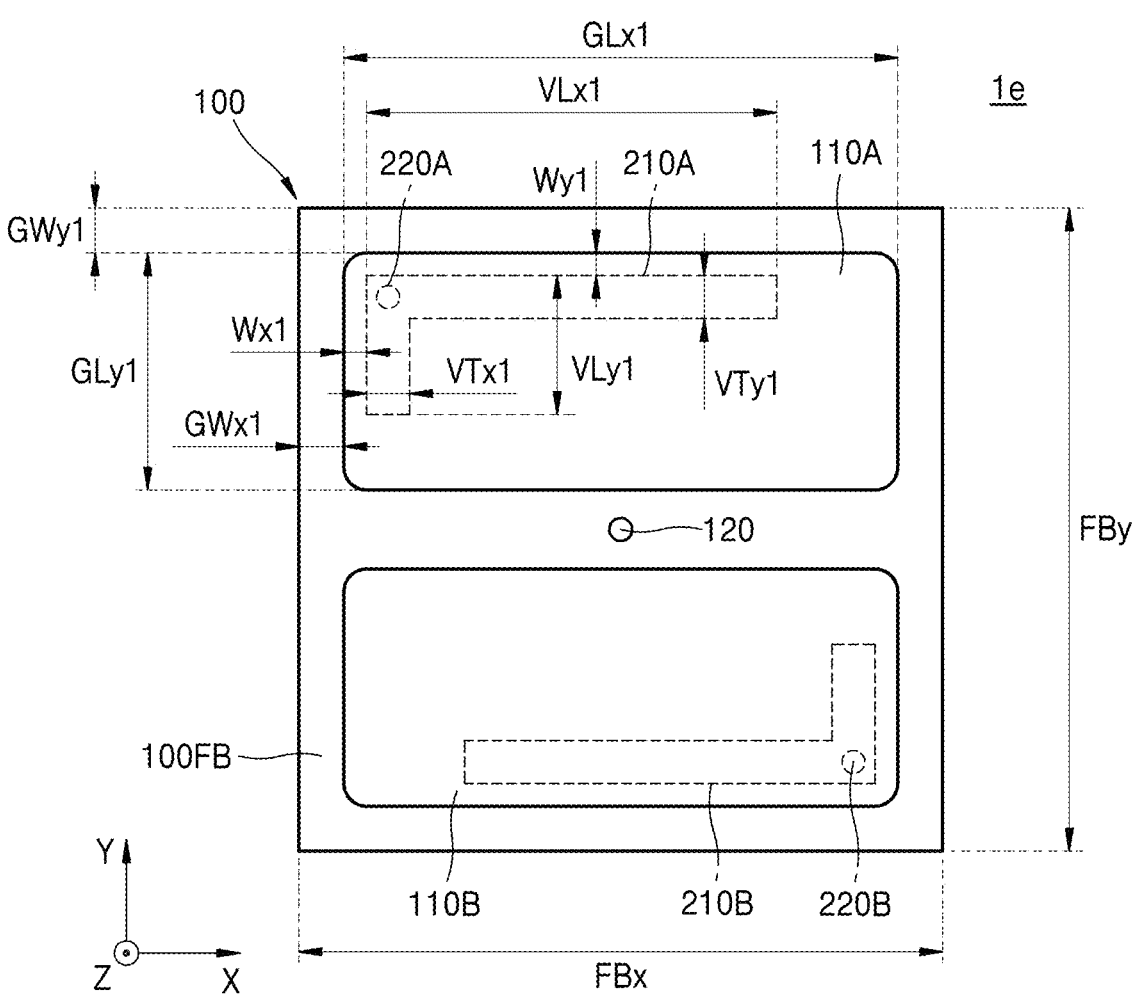
FIG. 12 is a plan view illustrating a bonding tool included in semiconductor manufacturing equipment according to an example embodiment of the present inventive concepts.

FIG. 12 is a plan view illustrating a bonding tool included in semiconductor manufacturing equipment 1e according to an example embodiment of the present inventive concepts. Referring to FIG. 12, the grooves 110A and 110B in FIG. 12 may have similar shapes as the grooves 110A and 110B in FIG. 11, but may be larger in the first surface 100FB. The first groove 110A and the second groove 110B may have the same shape and may be disposed above and below each other in the Y-axis direction relative to the center hole 120 in the first surface 100FB. The first groove 110A and the second groove 110B may be spaced apart from the circumference of the first surface 100FB, and the distance therebetween may be constant.

The X-axis direction horizontal sides of the first groove 110A may be spaced apart from the edge extending in the Y-axis direction of the first surface 100FB by a first x-axis gap GWx1. That is, the first x-axis length GLx1 is less than the horizontal side length FBx of the first surface 100FB, and the difference between the first x-axis length GLx1 and the horizontal side length FBx of the first surface 100FB may be twice the first x-axis gap GWx1. The first x-axis length GLx1 of the first groove 110A may be provided in the first surface 100FB so as to be greater than the channel X-axis length VLx1.

The Y-axis direction vertical side of the first groove 110A may be spaced apart from one of the edges extending in the X-axis direction of the first surface 100FB by a first Y-axis gap GWy1. The first y-axis length GLy1 of the first groove 110A may be less than half of the vertical length FBy of the first surface 100FB.

Grooves 110A and 110B may be provided in the first surface 100FB and may have rounded vertices at the boundary thereof. As described above, due to the rounded vertices, cases of falling bonding tools are reduced and the adhesion between the bonding tool 100 and the head heater 200 is increased, thereby reducing defects in the bonding process and improving the stability of the bonding process.

Figure 13:
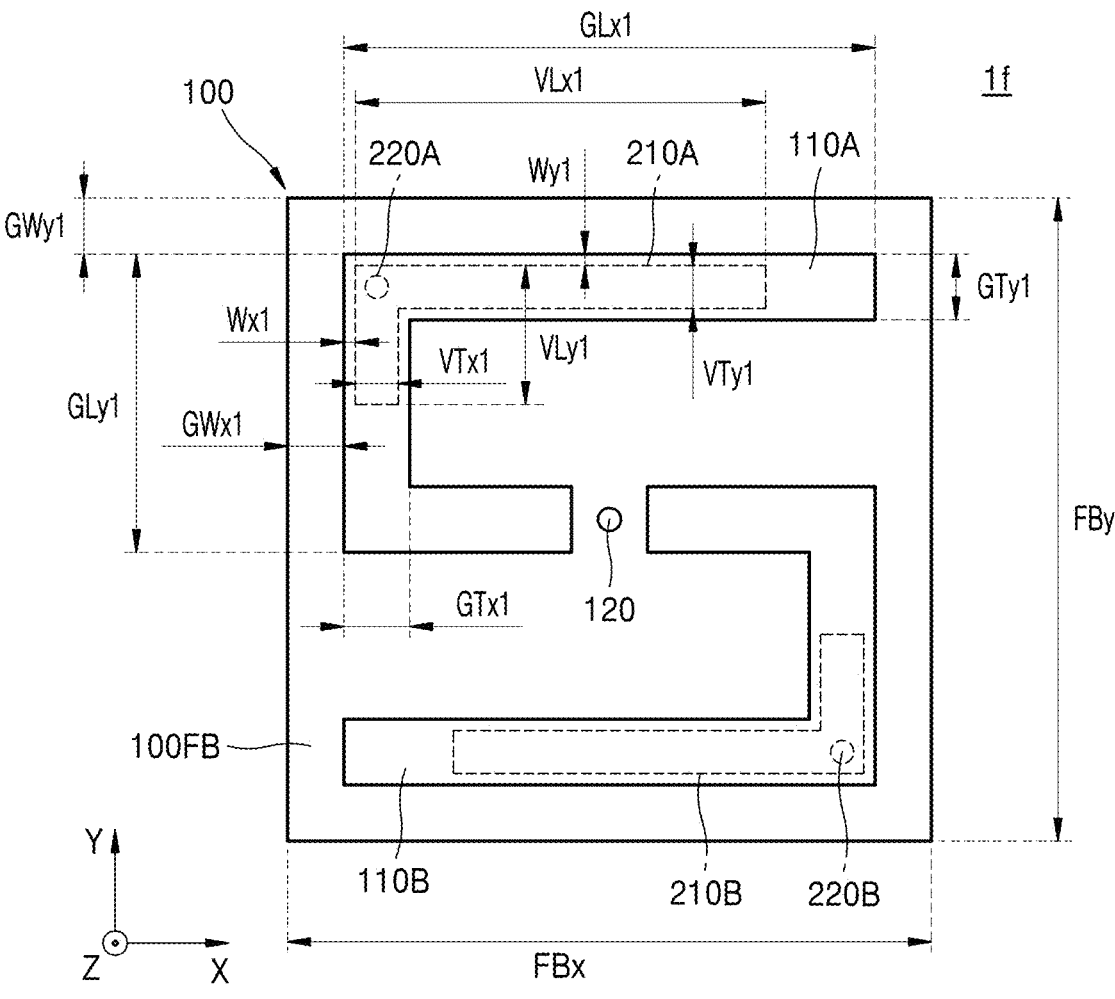
FIG. 13 is a plan view illustrating a bonding tool included in semiconductor manufacturing equipment according to an example embodiment of the present inventive concepts.

FIG. 13 is a plan view illustrating a bonding tool included in semiconductor manufacturing equipment if according to an example embodiment of the present inventive concepts. Referring to FIG. 13, in the Y-axis extension of each of the grooves 110A and 110B extending in the Y-axis direction as shown in FIG. 5, an additional X-axis extension of a corresponding one of the grooves 110A and 110B extending toward the center hole 120 in the X-axis direction may be provided in the first surface 100FB.

A bonding tool of the semiconductor manufacturing equipment if according to an example embodiment of the present inventive concepts may be used for the head heater 200 in FIG. 4A and also for the head heater 200 in FIG. 4B.

Figure 14:
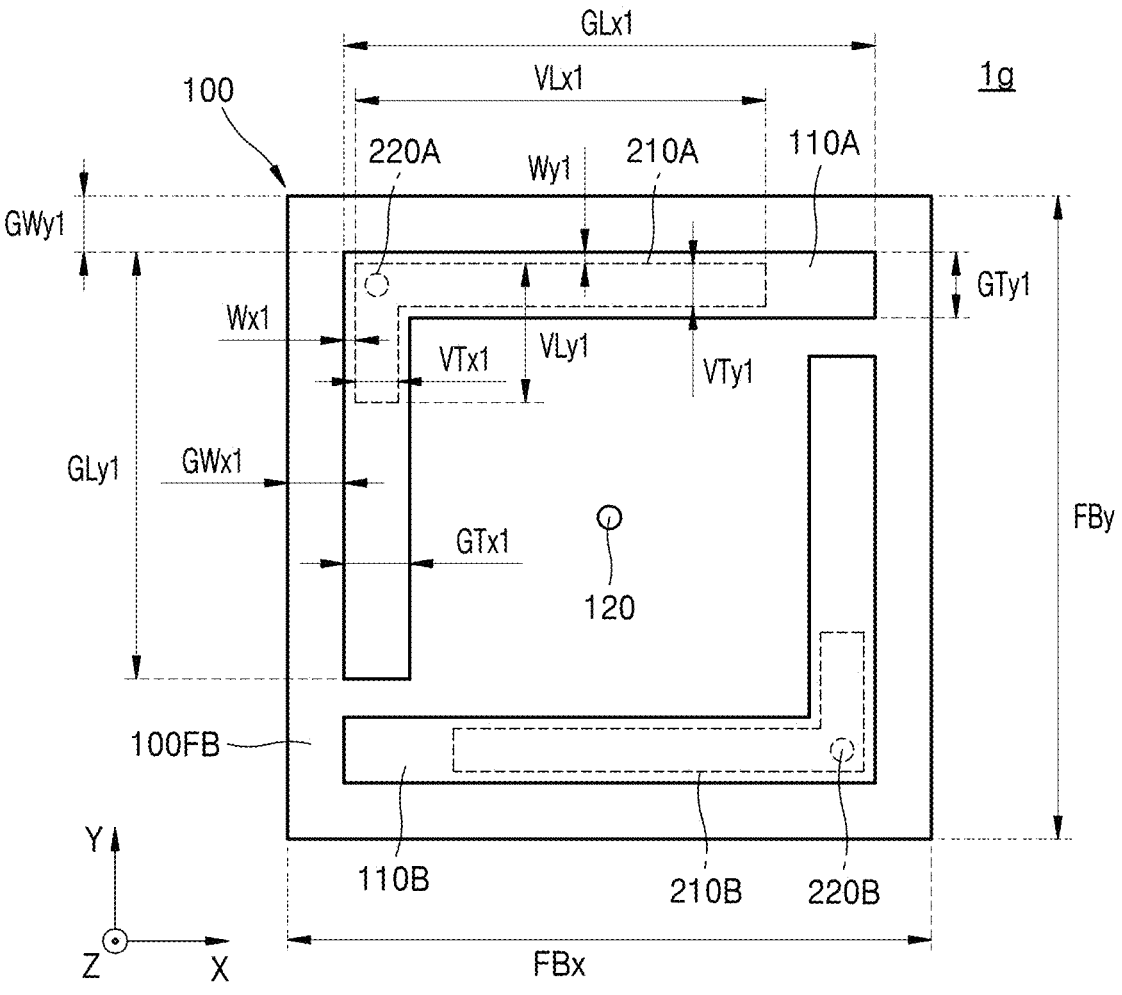
FIG. 14 is a plan view illustrating a bonding tool included in semiconductor manufacturing equipment according to an example embodiment of the present inventive concepts.

FIG. 14 is a plan view illustrating a bonding tool included in semiconductor manufacturing equipment 1g according to an example embodiment of the present inventive concepts. Referring to FIG. 14, the length of the Y-axis extension of the grooves 110A and 110B of FIG. 5 may be extended. The first y-axis length GLy1 of the first groove 110A may be less than the first x-axis length GLx1, and the difference between the first y-axis length GLy1 and the first x-axis length GLx1 may be less than the difference between corresponding lengths in a bonding tool of the semiconductor manufacturing equipment 1 in FIG. 5.

Figure 15:
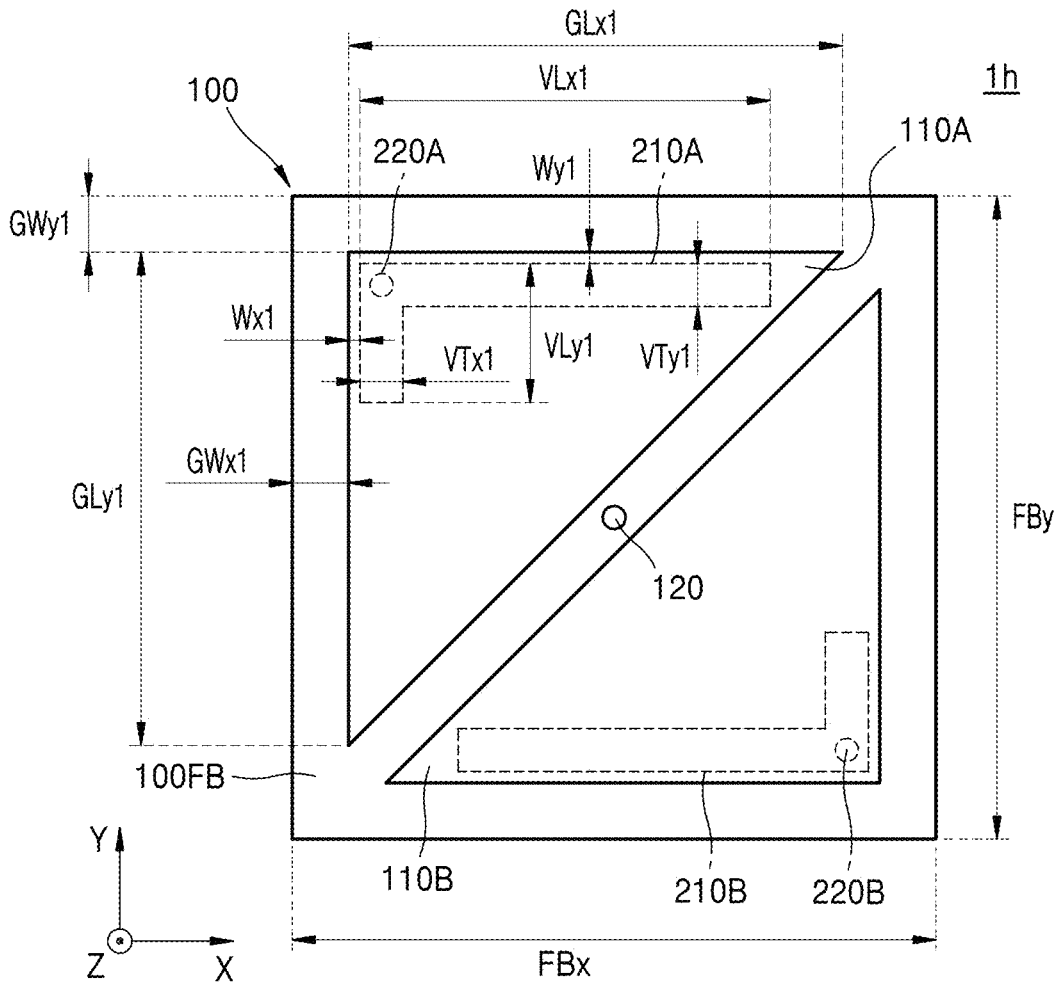
FIG. 15 is a plan view illustrating a bonding tool included in semiconductor manufacturing equipment according to an example embodiment of the present inventive concepts.

FIG. 15 is a plan view illustrating a bonding tool included in semiconductor manufacturing equipment 1h according to an example embodiment of the present inventive concepts. Referring to FIG. 15, the grooves 110A and 110B may have a right triangle shape in the first surface 100FB. The first groove 110A and the second groove 110B may be spaced apart from each other at regular intervals with the center hole 120 therebetween. In addition, the first groove 110A and the second groove 110B may be symmetrically positioned with respect to the center hole 120. The boundaries of the first groove 110A and the second groove 110B may be provided on the first surface 100FB to include the boundaries of the first negative pressure channel 210A and the second negative pressure channel 210B, respectively.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Some example embodiments of the present inventive concepts have been described above with reference to the accompanying drawings, but those skilled in the art to which the present inventive concepts pertains may understand that the present inventive concepts can be embodied in other specific shapes without changing its technical ideas or essential features. Therefore, the embodiments described above are illustrative in all respects and shall not be understood as limiting.

While the inventive concepts have been particularly shown and described with reference to some example embodiments thereof, it will be understood that various changes in form and details may be made therein without departing from the spirit and scope of the following claims.

What is claimed is:

1. Semiconductor manufacturing equipment comprising:
a main body including a bonding head;
a head heater at a bottom of the bonding head, the head heater including a thermal compression surface, negative pressure channels recessed upward from the thermal compression surface and the negative pressure channels including first holes, respectively, therein; and
a bonding tool including a first surface, a second surface, and grooves recessed downward from the first surface, the first surface configured to contact the thermal compression surface, the second surface being opposite to the first surface and configured to contact a semiconductor chip for a thermal compression,
wherein the grooves are in communication with the negative pressure channels so that a negative pressure supplied to the first holes is applied to the negative pressure channels and the grooves together, and
in a plan view, the negative pressure channels overlap the grooves, respectively, such that each of the negative pressure channels is within a corresponding one of the grooves.

2. The semiconductor manufacturing equipment of claim 1,
wherein at least a portion of an upper boundary of each of the grooves on the first surface is defined by the thermal compression surface.

3. The semiconductor manufacturing equipment of claim 2,
wherein an outer side boundary of one of the negative pressure channels and an outer side boundary of one of the grooves adjacent thereto are separated from each other by a distance.

4. The semiconductor manufacturing equipment of claim 3,
wherein the distance is between 0.1 mm and 2 mm.

5. The semiconductor manufacturing equipment of claim 3,
wherein vertices of the grooves are rounded, the vertices of the grooves each being a point at which two edges of the outer side boundary thereof meet each other.

6. The semiconductor manufacturing equipment of claim 3,
wherein a vertical level difference between each of bottom boundaries of the grooves and the first surface is constant.

7. The semiconductor manufacturing equipment of claim 3,
wherein the negative pressure channels have an 'L-shaped' planar shape on the thermal compression surface, and
the grooves have an 'L-shaped' planar shape on the first surface.

8. The semiconductor manufacturing equipment of claim 3,
wherein the negative pressure channels have first two 'L-shaped' planar shapes that are symmetrical to each other about a center of the thermal compression surface,
wherein the grooves have second two 'L-shaped' planar shapes that are symmetrical to each other about a center of the first surface, and
wherein each of the first two 'L-shaped' planar shapes faces includes a first extension extending in a first horizontal direction, a second extension extending from the first extension in a second horizontal direction crossing the first horizontal direction, and a first part at which the first extension and the second extension meet faces one of vertices of the thermal compression surface, and
each of the second two 'L-shaped' planar shapes includes a third extension extending in the first horizontal direction, a fourth extension extending from the third extension in the second horizontal direction, and a second part at which the third extension and the fourth extension meet faces one of vertices of the first surface.

9. The semiconductor manufacturing equipment of claim 8,
wherein the distance is between 0.1 mm and 2 mm, and vertices at both ends of at least one of the second two 'L-shaped' planar shapes are curved.

10. The semiconductor manufacturing equipment of claim 9,
wherein the first part of a corresponding one of the first two 'L-shaped' planar shapes includes a corresponding one of the first holes.

11. The semiconductor manufacturing equipment of claim 10,
wherein the first surface includes a center hole at the center of the first surface and the center hole is recessed from the first surface.

12. The semiconductor manufacturing equipment of claim 3,
wherein the first surface has a rectangular shape and a planar shape of the grooves is a rectangular shape, and
wherein a pair of parallel sides of at least one of the grooves are parallel to first direction sides of the first surface, and another pair of parallel sides of at least one of the grooves are parallel to second direction sides of the first surface.

13. The semiconductor manufacturing equipment of claim 12,
wherein four vertices of at least one of the grooves are rounded.

14. Semiconductor manufacturing equipment comprising:
a main body including a bonding head;
a head heater at a bottom of the bonding head, the head heater including a thermal compression surface, negative pressure channels recessed from the thermal compression surface and the negative pressure channels including first holes, respectively, therein; and
a bonding tool including a first surface, a second surface, and grooves at the first surface, the first surface configured to contact the thermal compression surface, the second surface being opposite to the first surface and configured to contact a semiconductor chip for thermal compression,
wherein the thermal compression surface has a rectangular shape with a first cut-out portion and a second cut-out portion removed inward from a pair of opposite edges of the rectangular shape, respectively, and
wherein the grooves are in communication with the negative pressure channels so that a negative pressure supplied to the first holes is applied to the negative pressure channels and the grooves together.

15. The semiconductor manufacturing equipment of claim 14,
wherein the negative pressure channels on the thermal compression surface are inside the grooves on the first surface, respectively, in a plan view such that the negative pressure channels overlap corresponding ones of the grooves, respectively.

16. The semiconductor manufacturing equipment of claim 15,
wherein vertices of the grooves are rounded, the vertices of the grooves each being a point at which two edges of an outer side boundary thereof meet each other.

17. The semiconductor manufacturing equipment of claim 16, comprising:
the first surface includes a center hole at a center thereof and the center hole is recessed from the first surface,
wherein two of the grooves are symmetrical to each other on the first surface with respect to the center hole.

18. Semiconductor manufacturing equipment comprising:
a main body including a bonding head;
a head heater at a bottom of the bonding head, the head heater including a thermal compression surface, negative pressure channels recessed from the thermal compression surface, and the negative pressure channels including first holes, respectively, therein; and
a bonding tool including a first surface, a second surface, and grooves at the first surface, the first surface configured to contact the thermal compression surface, the second surface being opposite to the first surface and configured to contact a semiconductor chip for thermal compression,
wherein the negative pressure channels on the thermal compression surface are within the grooves on the first surface, respectively, in a plan view so that a negative pressure supplied to the first holes is applied to the negative pressure channels and the grooves together, at least a portion of an upper boundary of each of the grooves on the first surface is defined by the thermal compression surface,
wherein an outer side boundary of one of the negative pressure channels and an outer side boundary of one of the grooves corresponding thereto are spaced apart by a first interval in a range between 0.1 mm and 2 mm, and
wherein vertices of the grooves on the first surface are rounded, the vertices of the grooves each being a point at which two edges of the outer side boundary thereof meet each other, and a vertical level difference between each of bottom boundaries of the grooves to the first surface and the first surface is constant.

19. The semiconductor manufacturing equipment of claim 18, wherein
the first surface includes a center hole at a center thereof and the center hole is recessed from the first surface,
the negative pressure channels have first two 'L-shaped' planar shapes symmetrical with respect to the center of the thermal compression surface, and the grooves have second two 'L-shaped' planar shapes that are symmetrical to each other with respect to the center hole,
each of the first two 'L-shaped' planar shapes includes a first extension extending in a first horizontal direction, a second extension extending from the first extension in a second horizontal direction crossing the first horizontal direction, and a first part at which the first extension and the second extension meets faces one of vertices of the thermal compression surface, and
each of the second two 'L-shaped' planar shapes includes a third extension extending in the first horizontal direction, a fourth extension extending from the third extension in the second horizontal direction, and a second part at which the third extension and the fourth extension meets faces one of vertices of the first surface.

* * * * *